United States Patent
Kawasaki (10) Patent No.: US 7,608,861 B2
(45) Date of Patent: Oct. 27, 2009

(54) ACTIVE MATRIX TYPE DISPLAY HAVING TWO TRANSISTORS OF OPPOSITE CONDUCTIVITY ACTING AS A SINGLE SWITCH FOR THE DRIVING TRANSISTOR OF A DISPLAY ELEMENT

(75) Inventor: Somei Kawasaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 367 days.

(21) Appl. No.: 11/152,188

(22) Filed: Jun. 15, 2005

(65) Prior Publication Data

US 2005/0285151 A1    Dec. 29, 2005

(30) Foreign Application Priority Data

Jun. 24, 2004    (JP)    .............................. 2004-186483

(51) Int. Cl.
*H01L 33/00*    (2006.01)
*G06F 3/038*    (2006.01)
*G09G 5/00*    (2006.01)
*G09G 3/32*    (2006.01)

(52) U.S. Cl. .................. 257/93; 257/88; 257/E33.044; 345/205; 345/206; 345/1.2; 345/82

(58) Field of Classification Search ................. 345/100, 345/99, 76, 55, 30, 204, 84, 90, 92, 93, 98, 345/206, 205, 1.2, 82, 212; 257/80, 83, 84, 257/88, 184, 187, 257, 258, 291, 93
See application file for complete search history.

(56) References Cited

U.S. PATENT DOCUMENTS

| | | | |
|---|---|---|---|
| 6,373,454 B1 | 4/2002 | Knapp et al. ................... | 345/76 |
| 6,859,193 B1 | 2/2005 | Yumoto ........................ | 345/82 |
| 6,885,029 B2 | 4/2005 | Miyazawa .................... | 257/59 |
| 7,187,004 B2 | 3/2007 | Miyazawa .................... | 259/59 |
| 2002/0011981 A1* | 1/2002 | Kuijk ........................... | 345/92 |

(Continued)

FOREIGN PATENT DOCUMENTS

JP    2002-517806    6/2002

(Continued)

*Primary Examiner*—Phat X Cao
*Assistant Examiner*—Diana C Garrity
(74) *Attorney, Agent, or Firm*—Fitzpatrick, Cella, Harper & Scinto (57) ABSTRACT

An active matrix type display device having a plurality of pixel circuits (1) arranged in a matrix shape. The pixel circuit has: a display device (EL); a drive transistor (M1) of a first conductivity type for controlling a current flowing in the display device; a capacitor (C1) provided at a control electrode of the drive transistor; and a switch (M2a, M2b), connected to the control electrode of the drive transistor, for holding a drive control signal at the capacitor. The switch includes a switching transistor (M2a) of the first conductivity type and a switching transistor (M2b) of a second conductivity type in which one main electrode of the switching transistor of the first conductivity type and one main electrode of the switching transistor of the second conductivity type are connected serially. One of the other main electrode of the switching transistor of the first conductivity type and the other main electrode of the switching transitor of the second conductivity type is connected to the control electrode of the drive transistor.

4 Claims, 8 Drawing Sheets

U.S. PATENT DOCUMENTS

| | | | |
|---|---|---|---|
| 2002/0158993 A1* | 10/2002 | Murai | 349/38 |
| 2003/0132931 A1 | 7/2003 | Kimura et al. | 345/212 |
| 2003/0214465 A1 | 11/2003 | Kimura | 345/76 |
| 2004/0066357 A1* | 4/2004 | Kawasaki | 345/76 |
| 2004/0100319 A1* | 5/2004 | Pennock et al. | 327/407 |
| 2004/0183752 A1 | 9/2004 | Kawasaki et al. | 345/20 |
| 2005/0007359 A1 | 1/2005 | Iseki et al. | 345/204 |
| 2005/0122150 A1 | 6/2005 | Iseki et al. | 327/215 |
| 2005/0168905 A1* | 8/2005 | Kimura | 361/204 |
| 2006/0114194 A1 | 6/2006 | Kawasaki et al. | 345/76 |
| 2006/0132395 A1 | 6/2006 | Kawasaki et al. | 345/75.2 |
| 2006/0145960 A1 | 7/2006 | Koga et al. | 345/76 |

FOREIGN PATENT DOCUMENTS

| | | |
|---|---|---|
| JP | 2003-202833 | 7/2003 |
| JP | 2004-126512 | 4/2004 |
| JP | 2004-126526 | 4/2004 |
| JP | 2005-157263 | 6/2005 |
| WO | WO 01/06484 | 1/2001 |
| WO | 01/91094 | 11/2001 |

* cited by examiner

ACTIVE MATRIX TYPE DISPLAY HAVING TWO TRANSISTORS OF OPPOSITE CONDUCTIVITY ACTING AS A SINGLE SWITCH FOR THE DRIVING TRANSISTOR OF A DISPLAY ELEMENT

BACKGROUND OF THE INVENTION

1. Field of the Invention

The invention relates to an active matrix type display apparatus and a driving device of a load which are used for a television receiver, monitors of a computer, a cellular phone, a digital camera, a digital video camera (camcorder), and the like, an exposure device for an electrophotography printer, an exposure light source for a photolithography, and the like. More particularly, the invention relates to an active matrix type display apparatus (or device) and a driving device (or apparatus) of an active device as a load which are preferably used for a current driving type display device.

2. Related Background Art

Figure 12:
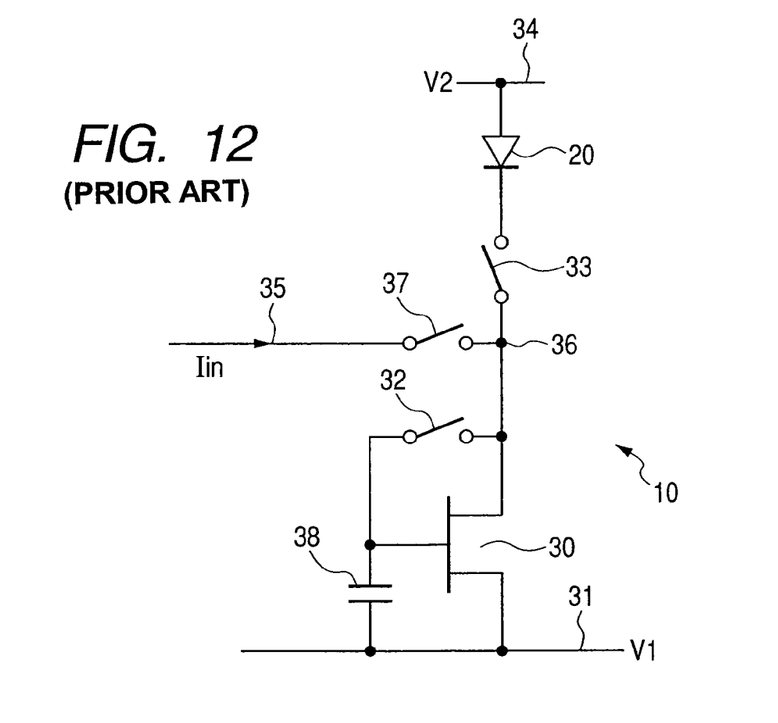
FIG. 12 is a circuit diagram of a conventional pixel circuit.

As an active matrix electroluminescent display device, for example, there is a device disclosed in JP-A-2002-517806. FIG. 12 is a circuit diagram of a conventional pixel circuit.

The circuit shown in FIG. 12 operates as follows. Switches (transistors) 37 and 32 are closed. A switch (transistor) 33 is opened. An input signal Iin corresponding to a device current necessary for light emission of an electroluminescent device 20 as an active device is inputted. A voltage across a capacitor 38 in a stationary state becomes a gate-source voltage necessary to drive a current flowing in a channel of a drive transistor 30. When the switches 37 and 32 are opened, the gate-source voltage which is determined in accordance with the input signal Iin is held in the capacitor 38.

Subsequently, when the switch 33 is closed, a drive current according to a level of the holding voltage flows in the electroluminescent device 20 through the drive transistor 30, so that light is emitted. Reference numeral 34 denotes a power line for setting a voltage (V2) on the anode side of the electroluminescent device 20 and 31 indicates a power line for setting a voltage (V1) on the source side of the transistor.

In JP-A-2002-517806, there is such a disclosure that n-type MOS transistors are used as transistors 32, 37, and 30 and a p-type MOS transistor is used as a transistor 33.

There is also known a pixel circuit in which a p-type MOS transistor is used as a drive transistor and a p-type MOS transistor is used as a switching transistor for short-circuiting a circuit between a gate and a drain of the drive transistor. (Refer to the Official Gazette of International Publication No. WO01/91094.)

In the active matrix type display device and the driving apparatus of the active device, there is still a room to be improved from two viewpoints in which the drive current in the dark state is set to zero and a fluctuation of the drive current due to an unnecessary leakage current is prevented.

SUMMARY OF THE INVENTION

It is an object of the invention to provide an active matrix type display device and a driving apparatus of an active device, in which a drive current in a dark state is suppressed and an unnecessary leakage current can be suppressed.

It is another object of the invention to provide an active matrix type display apparatus and a driving device of a load, in which luminance in a dark state due to a fluctuation of a holding voltage accompanied by the switching operation can be reduced and a fluctuation of the luminance due to an unnecessary leakage current can be suppressed.

According to the first invention of the present invention, there is provided an active matrix type display apparatus having a plurality of pixel circuits arranged in a matrix, wherein the pixel circuit comprises:

a display element;

a drive transistor of a first conductivity type for controlling a current flowing in the display element;

a capacitor provided at a control electrode of the drive transistor; and a switch, connected to the control electrode of the drive transistor, for holding a drive control signal at the capacitor, and the switch includes a switching transistor of the first conductivity type and a switching transistor of a second conductivity type in which one main electrode of the switching transistor of the first conductivity type and one main electrode of the switching transistor of the second conductivity type are connected, and one of the other main electrode of the switching transistor of the first conductivity type and the other main electrode of the switching transistor of the second conductivity type is connected to the control electrode of the drive transistor.

According to the second invention of the present invention, there is provided a driving device of a load, comprising:

a drive transistor of a first conductivity type for controlling a current flowing in the load;

a capacitor provided at a control electrode of the drive transistor; and a switch, connected to the control electrode of the drive transistor, for holding a drive control signal at the capacitor, and the switch includes a switching transistor of the first conductivity type and a switching transistor of a second conductivity type in which one main electrode of the switching transistor of the first conductivity type and one main electrode of the switching transistor of the second conductivity type are connected, and one of the other main electrode of the switching transistor of the first conductivity type and the other main electrode of the switching transistor of the second conductivity type is connected to the control electrode of the drive transistor.

According to the third invention of the present invention, there is provided an electro-luminescent display apparatus comprising:

a plurality of pixel circuits arranged in a matrix an electro-luminescent display element on said pixel circuit;

wherein said pixel circuit comprises:

a drive transistor of a first conductivity type for controlling a current flowing in said display element;

a capacitor provided at a control electrode of said drive transistor; and a switch, connected to said control electrode of said drive transistor, for holding a drive control signal at said capacitor, and said switch includes a switching transistor of the first conductivity type and a switching transistor of a second conductivity type in which one main electrode of said switching transistor of the first conductivity type and one main electrode of said switching transistor of the second conductivity type are connected, and one of the other main electrode of said switching transistor of the first conductivity type and the other main electrode of said switching transistor of the second conductivity type is connected to said control electrode of said drive transistor.

According to the fourth invention of the present invention, there is provided a light emitting apparatus comprising:

a plurality of pixel circuits arranged in a matrix, a light emitting element being connected with said pixel circuit;

wherein said pixel circuit comprises:

a drive transistor of a first conductivity type for controlling a current flowing in said display element;

a capacitor provided at a control electrode of said drive transistor; and a switch, connected to said control electrode of said drive transistor, for holding a drive control signal at said capacitor, and said switch includes a switching transistor of the first conductivity type and a switching transistor of a second conductivity type in which one main electrode of said switching transistor of the first conductivity type and one main electrode of said switching transistor of the second conductivity type are connected, and one of the other main electrode of said switching transistor of the first conductivity type and the other main electrode of said switching transistor of the second conductivity type is connected to said control electrode of said drive transistor.

As will be explained hereinafter with reference to FIG. 1, it is preferable to construct in such a manner that the other one of the other main electrode of a switching transistor M2$a$ of the first conductivity type and the other main electrode of a switching transistor M2$b$ of the second conductivity type is connected to one main electrode (drain) of a drive transistor M1, and by turning on both of the switching transistor of the first conductivity type and the switching transistor of the second conductivity type, the control electrode (gate) and the one main electrode (drain) of the drive transistor are short-circuited.

It is also preferable that the other main electrode of the switching transistor of the first conductivity type is connected to the control electrode of the drive transistor.

Further, it is also preferable that a switching transistor M3 of the second conductivity type for selecting a row is provided between the one main electrode (drain) of the drive transistor and a signal line (Idata, d(x, y)), a switching transistor M4 of the first conductivity type for selecting light emission is provided on a path of the current flowing in the display device (EL), and a control electrode of the switching transistor M2$b$ of the second conductivity type, a control electrode of the switching transistor M3 for selecting the row, and a control electrode of the switching transistor M4 for selecting the light emission are connected in common to a second scan signal line.

Figure 2:
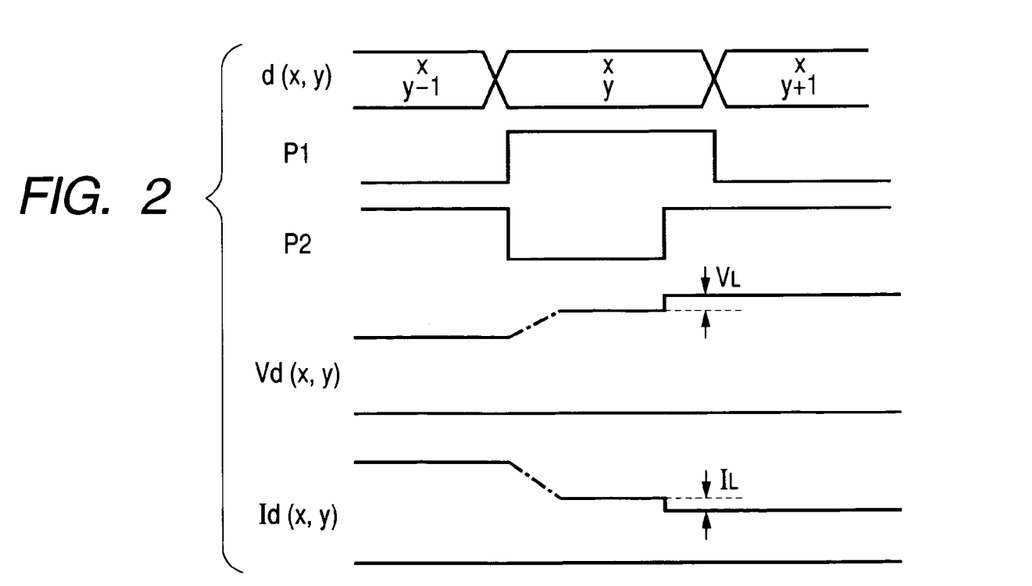
FIG. 2 is a timing chart for explaining the operation of the pixel circuit according to the first embodiment of the invention.

As shown in FIG. 2, it is also preferable that after time when the switching transistor of the first conductivity type is changed from ON to OFF (timing when P2 is changed from the low level to the high level), the switching transistor of the second conductivity type is changed from ON to OFF (P2 is changed from the high level to the low level).

Or, as will be explained hereinafter with reference to FIG. 9, it is also preferable that the other main electrode of the switching transistor of the second conductivity type is connected to one main electrode of the drive transistor.

Figure 9:
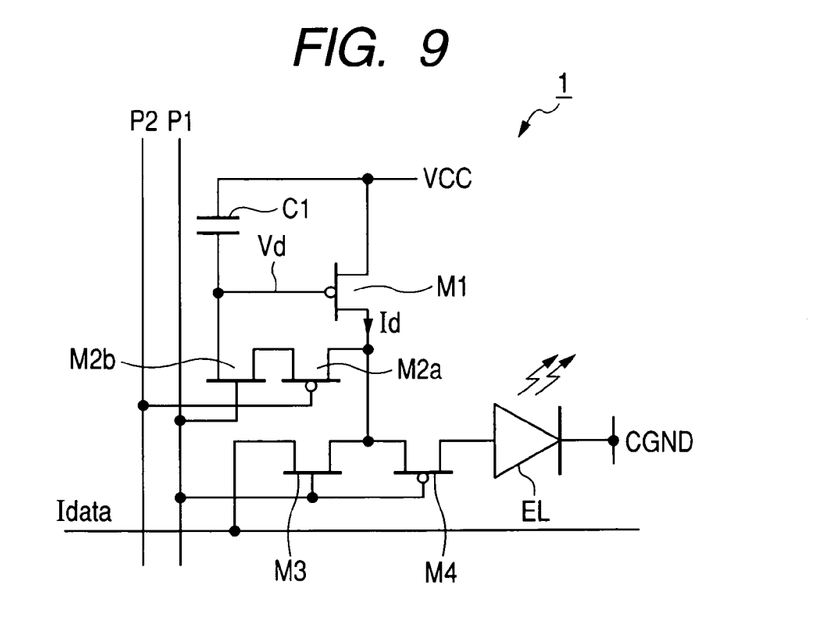
FIG. 9 is a diagram showing an example of a construction of a pixel circuit according to the second embodiment of the invention.

Also in the case of FIG. 9, it is also preferable that the switching transistor of the second conductivity type for selecting the row is provided between the one main electrode of the drive transistor and the signal line, the switching transistor of the first conductivity type for selecting the light emission is provided on the path of the current flowing in the display device, and the control electrode of the switching transistor of the second conductivity type, the control electrode of the switching transistor for selecting the row, and the control electrode of the switching transistor for selecting the light emission are connected in common to the second scan signal line.

As will be explained hereinafter with reference to FIGS. 10 and 11, it is also preferable that the other one of the other main electrode of the switching transistor of the first conductivity type and the other main electrode of the switching transistor of the second conductivity type is connected to an output terminal of a voltage buffer X, and an input terminal of the voltage buffer is connected to the signal line (Idata, d(x, y)).

Figure 10:
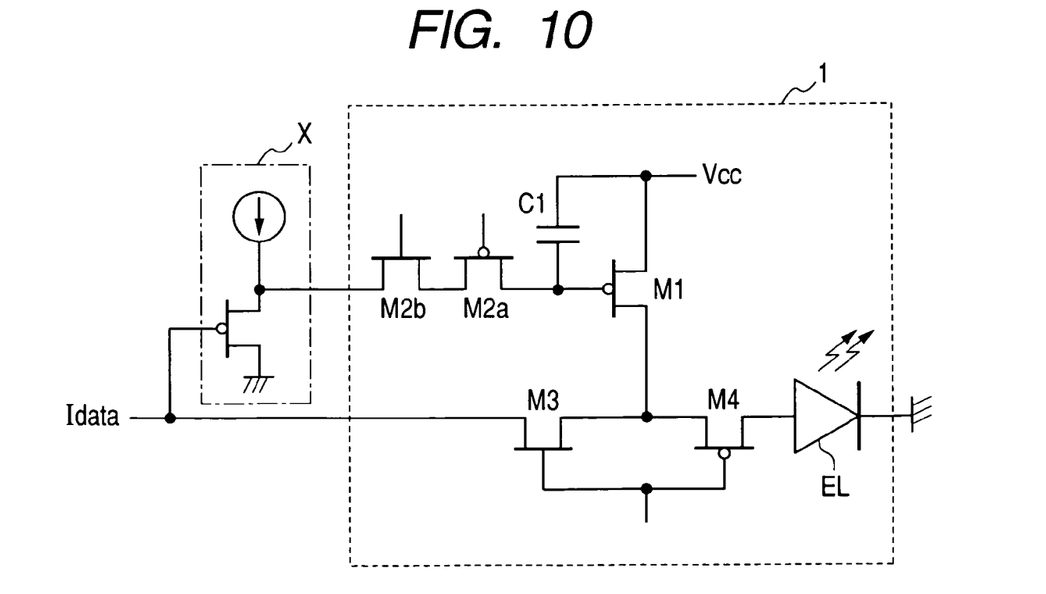
FIG. 10 is a diagram showing an example of a construction of a pixel circuit and a voltage buffer circuit according to the third embodiment of the invention.

As shown in FIG. 10, it is also preferable that the other one of the other main electrode of the switching transistor of the first conductivity type and the other main electrode of the switching transistor of the second conductivity type is connected to an output terminal of a source follower circuit and an input terminal of the source follower circuit is connected to the signal line.

Figure 11:
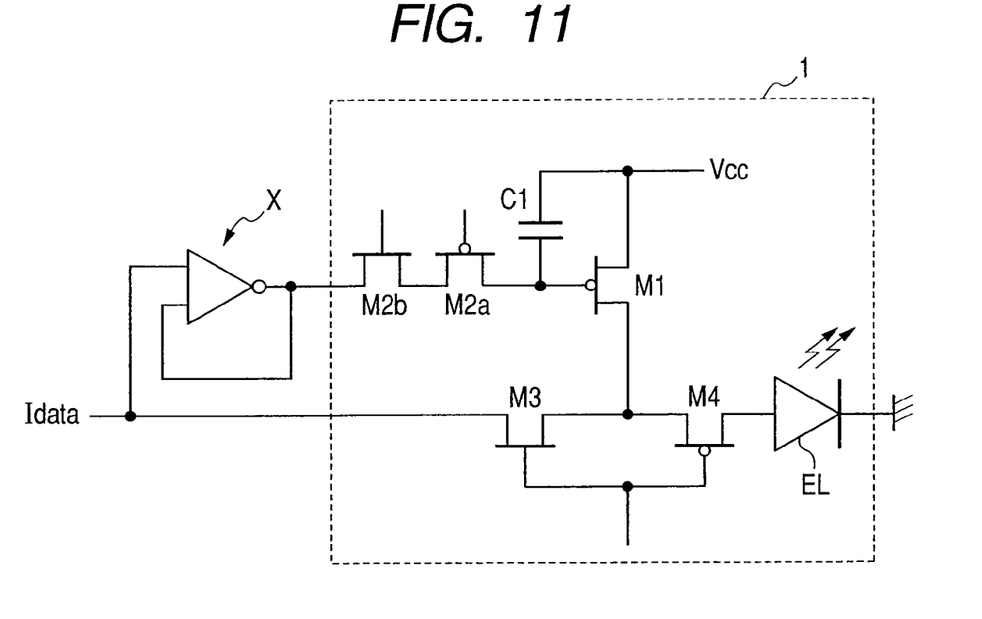
FIG. 11 is a diagram showing a modification of the pixel circuit and the voltage buffer circuit according to the third embodiment of the invention.

As shown in FIG. 11, it is also preferable that the other one of the other main electrode of the switching transistor of the first conductivity type and the other main electrode of the switching transistor of the second conductivity type is connected to an output terminal of a feedback type operational amplifier and an input terminal of the feedback type operational amplifier is connected to the signal line.

According to the present invention, it is also preferable that the drive transistor of the first conductivity type and the switching transistor of the first conductivity type are p-channel type thin film transistors and the switching transistor of the second conductivity type is an n-channel type thin film transistor.

DETAILED DESCRIPTION OF THE PREFERRED EMBODIMENTS

Figure 6:
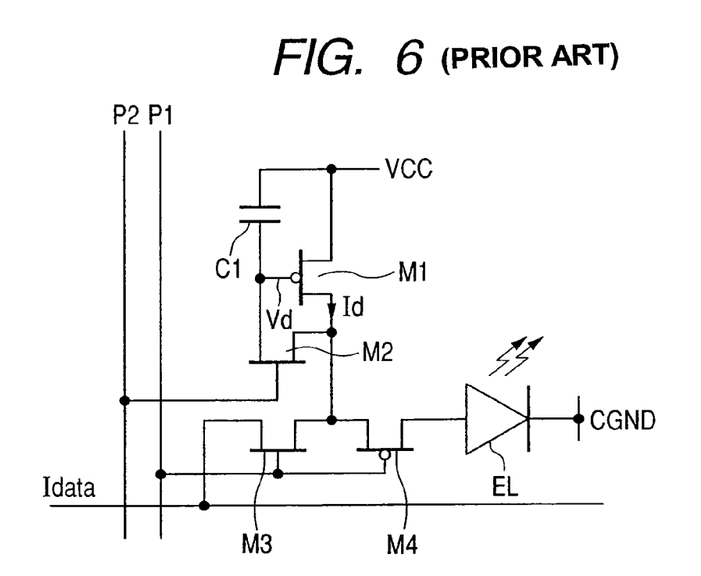
FIG. 6 is a diagram showing a construction of a pixel circuit of a comparison example regarding the first embodiment of the invention.

In a pixel circuit shown in FIG. 6, the inventors et al. of the present invention manufactured the pixel circuit by using: a p-type MOS transistor using low-temperature polysilicon as a drive transistor; and an n-type MOS transistor using low-temperature polysilicon as a switching transistor for short-circuiting a circuit between a gate and a drain of the drive transistor. In this case, in a black display mode, sufficient darkness is not accomplished due to a drop of a voltage held between the gate and a source accompanied by the switching operation. This results in reduction of contrast in the case of using the pixel circuit for a display device, an exposure device, or an exposure light source.

A pixel circuit is also manufactured by using: a p-type MOS transistor using low-temperature polysilicon as a drive transistor; and a p-type MOS transistor using low-temperature polysilicon as a switching transistor for short-circuiting a circuit between the gate and the drain of the drive transistor. In this case, although the sufficient darkness is obtained in the black display mode, it has been found that a leakage current through the switching transistor occurs. Preferred embodiments to solve such problems will be described in detail hereinbelow with reference to the drawings.

According to the preferred embodiments of the invention, the reduction of the contrast due to the fluctuation in holding voltage accompanied by the switching operation can be suppressed and the generation of the leakage current can be suppressed.

First Embodiment

Figure 1:
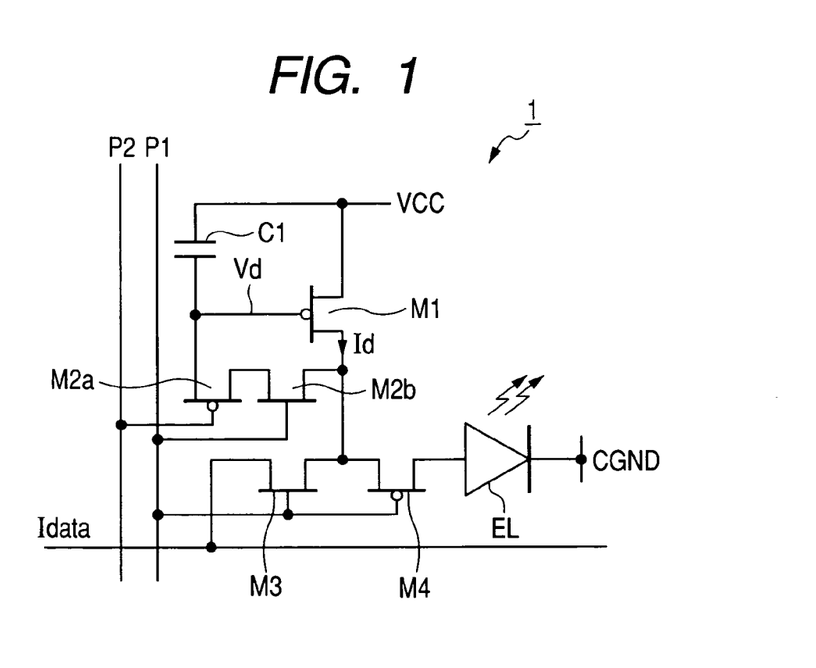
FIG. 1 is a diagram showing an example of a construction of a pixel circuit according to the first embodiment of the invention.

FIG. 1 is a diagram showing an example of a construction of a pixel circuit according to the first embodiment of the invention. FIG. 2 is a timing chart for explaining the operation of the pixel circuit of FIG. 1.

Figure 3:
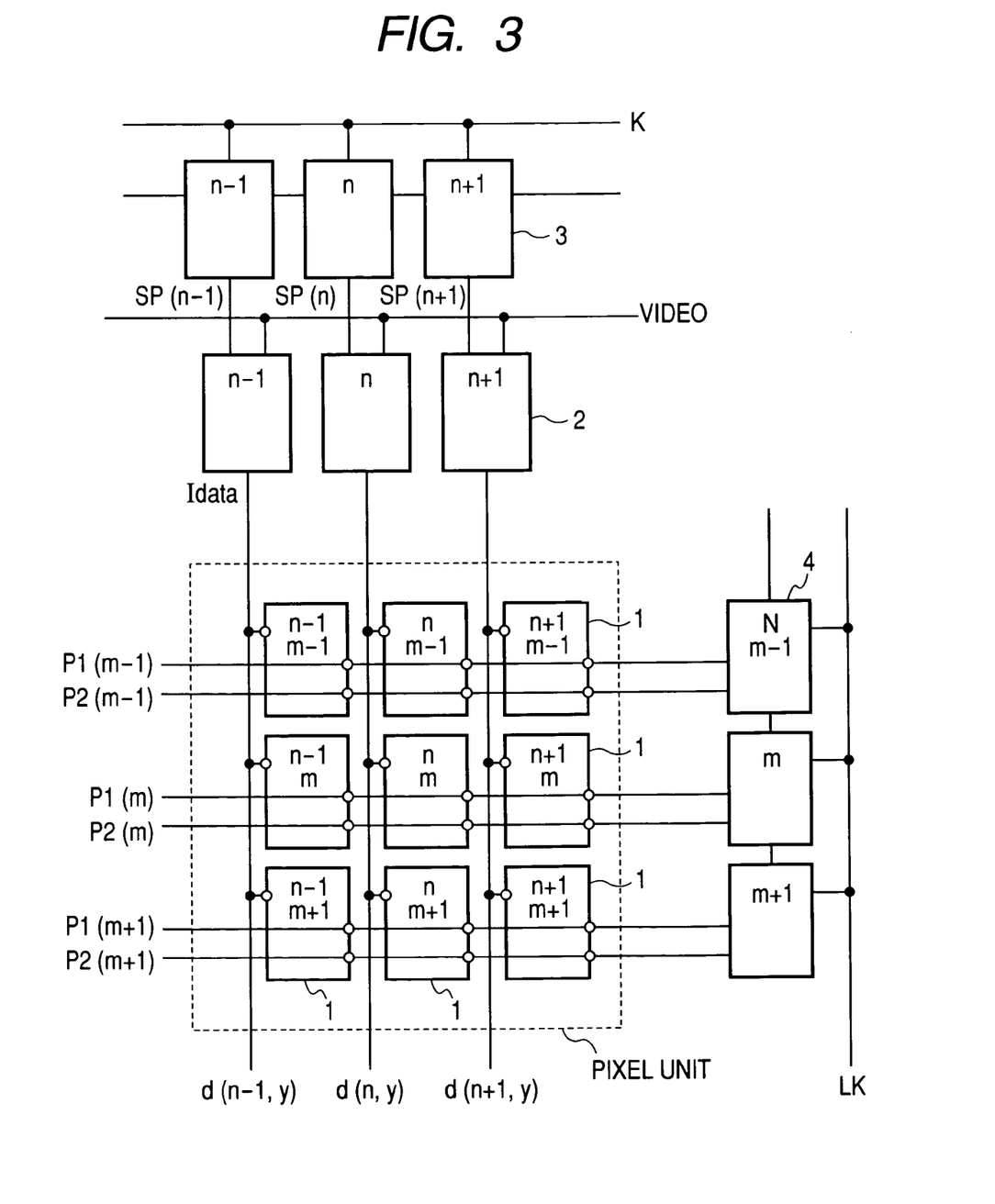
FIG. 3 is a diagram showing a construction of an active matrix electroluminescent display device according to the invention.

FIG. 3 is a constructional diagram showing a construction of an active matrix electroluminescent display device according to the invention.

In FIG. 3, reference numeral 1 denotes pixel circuits arranged in a matrix shape; 2 voltage-current converting circuits as signal line drive circuits which are connected to the pixel circuits 1 arranged in the column direction and supply line sequential data line current signals Idata to the pixel circuits 1 through signal lines d(x, y); 3 column shift registers connected to the voltage-current converting circuits 2; and 4 row shift registers serving as scan line drive circuits which are connected to the pixel circuits 1 arranged in the row direction and output a row scan signal P1 and a row scan signal P2 to the pixel circuits 1. A plurality of pixel circuits 1 are arranged in a matrix shape and construct a pixel unit.

Figure 4:
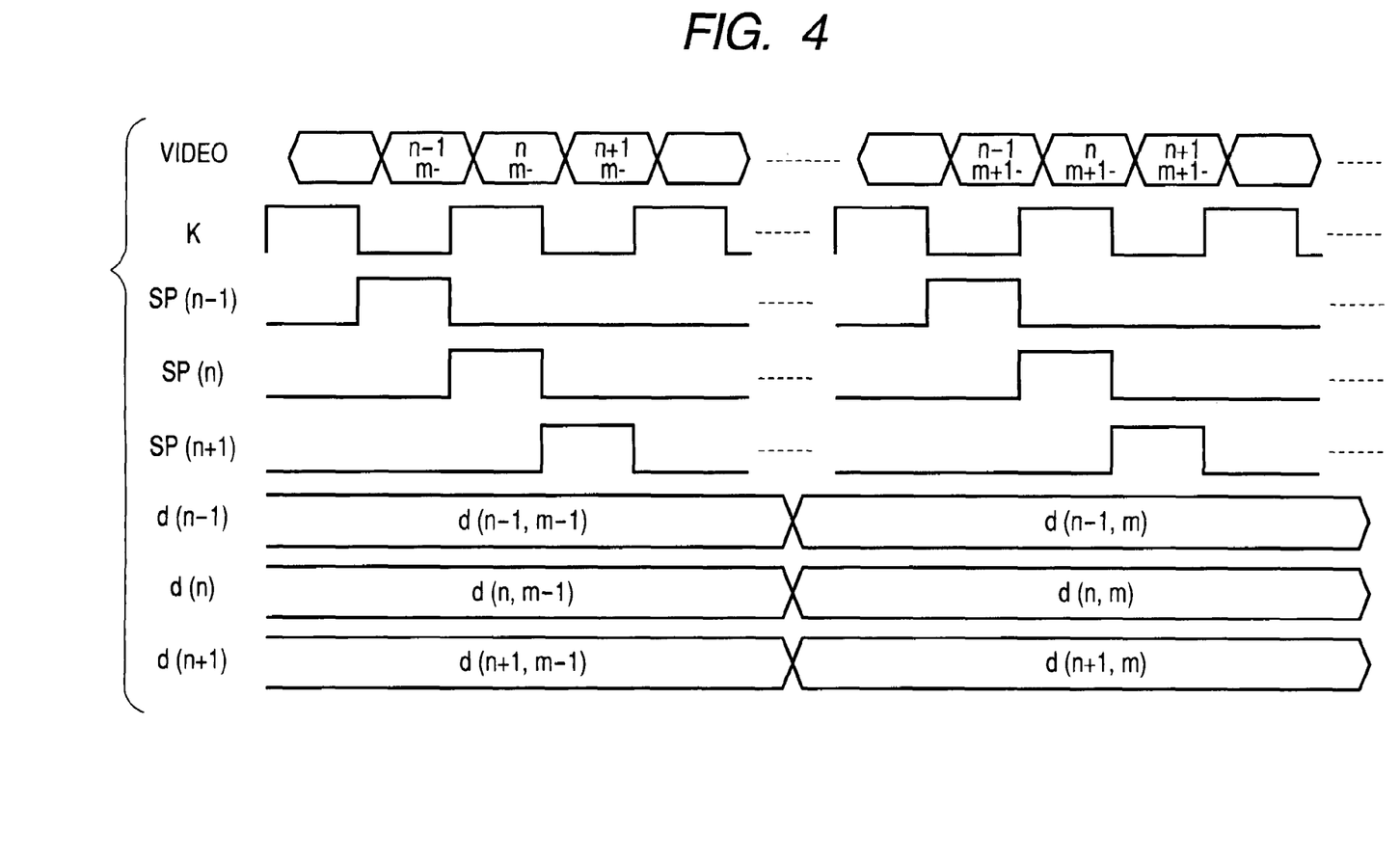
FIG. 4 is a timing chart for explaining the generating operation of line sequential data line signals.

FIG. 4 is a timing chart for explaining the generating operation of the line sequential data line signals. A clock signal K is inputted to the column shift registers 3. A video signal (Video) is inputted to the voltage-current converting circuits 2. The voltage-current converting circuits 2 supply the line sequential data line current signals Idata (d(n−1) to d(n+1)) to the columns of the pixel circuits on the basis of signals SP(n−1) to SP(n+1) from the column shift registers 3.

Figure 5:
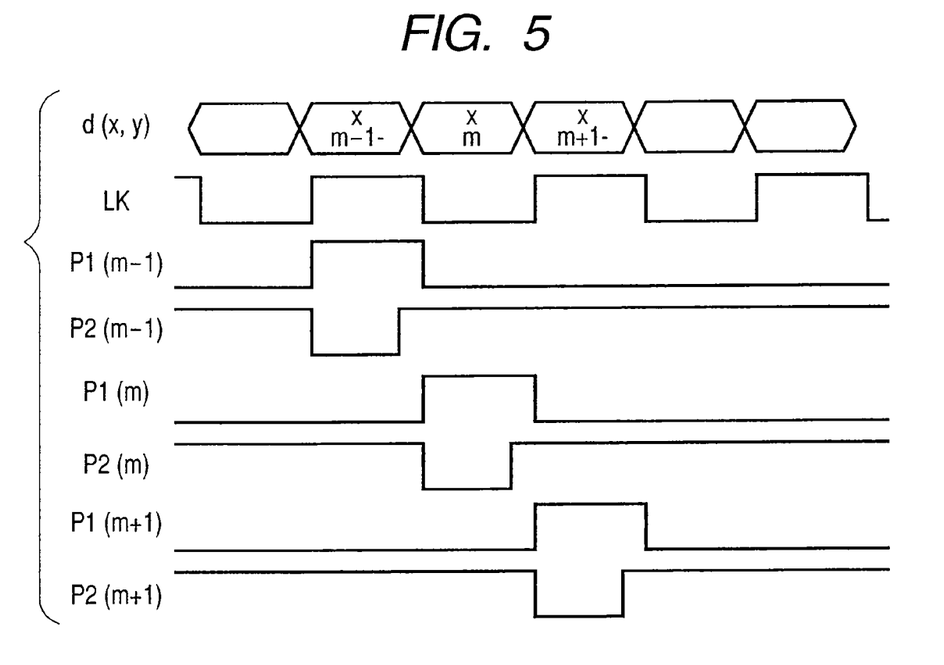
FIG. 5 is a timing chart for explaining the generating operation of row scan signals of the pixel circuit shown in FIG. 1.

FIG. 5 is a timing chart for explaining the generating operation of row scan signals of the pixel circuit shown in FIG. 1, which will be explained hereinafter. A clock signal LK is inputted to the row shift registers 4. The row scan signals P1 (P1(m−1) to P1(m+1)) and the row scan signals P2 (P2(m−1) to P2(m+1)) are sequentially outputted from the row shift registers 4 to the rows of the pixel circuits 1.

Figure 7:
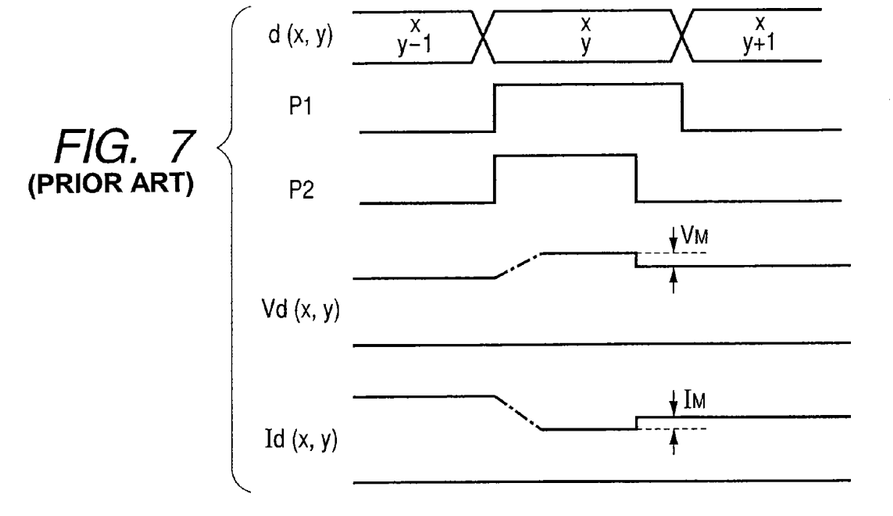
FIG. 7 is a timing chart for explaining the operation of the pixel circuit in FIG. 6.
Figure 8:
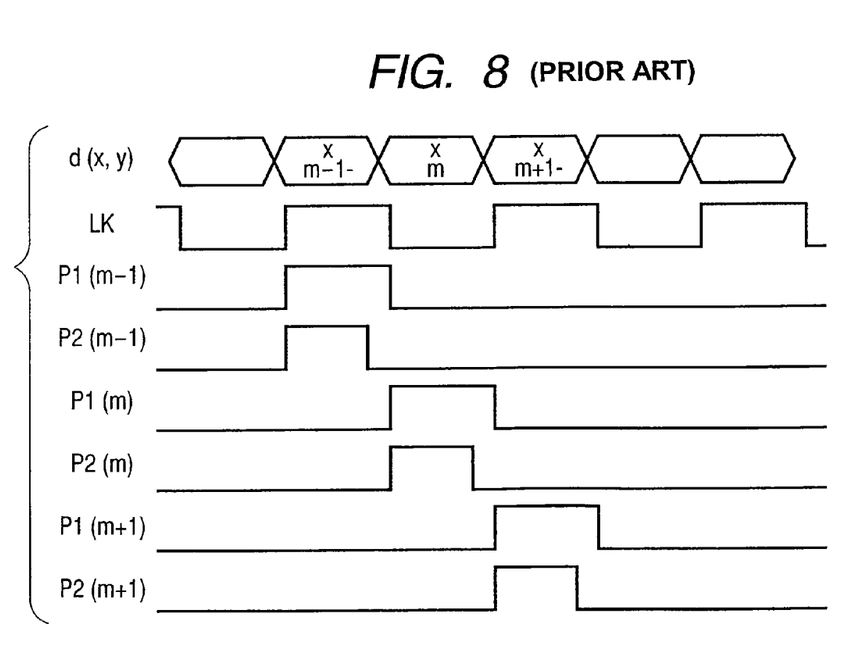
FIG. 8 is a timing chart for explaining the generating operation of row scan signals of the pixel circuit shown in FIG. 6.

FIG. 6 is a diagram showing a construction of a pixel circuit of a comparison example regarding the embodiment of the invention. FIG. 7 is a timing chart for explaining the operation of the pixel circuit in FIG. 6. FIG. 8 is a timing chart for explaining the generating operation of row scan signals of the pixel circuit shown in FIG. 6.

A fundamental construction regarding the programming operation of the current signals Idata in the comparison example of FIG. 6 is substantially the same as that of the pixel circuit shown in FIG. 12. In FIG. 12, the switch 32 can be regarded as an nMOS transistor M2, the switch 37 can be regarded as an nMOS transistor M3, and the switch 33 can be regarded as a pMOS transistor M1.

First, prior to explaining the embodiment, the comparison example will be described for enabling the construction of the invention to be easily understood.

The operation of the pixel circuit shown in FIG. 6 of x-column and y-row in the case of displaying the pixel in a position of x-column and y-row in the black display mode will now be considered. In FIG. 7, when the row scan signal P1 is set to the high level, the nMOS transistor M3 serving as a switch for a first program (for selecting the row) is turned on and the pMOS transistor M4 serving as a switch for selecting the light emission is turned off. When the row scan signal P2 is set to the high level, the nMOS transistor M2 serving as a switch for a second program is turned on. A voltage of a capacitor C1 connected to a gate of the pMOS transistor M1 serving as a drive transistor is set to a gate-source voltage enough to allow a current for driving an electroluminescent device EL as an active device to flow through the pMOS transistor M1. Subsequently, when the row scan signal P2 is set to the low level, the nMOS transistor M2 serving as a switch for the second program is turned off and the voltage of the capacitor C1 is held. A period of time so far is called a programming period.

After that, when the row scan signal P1 is set to the low level, the nMOS transistor M3 serving as a switch for the first program (for selecting the row) is turned off and the PMOS transistor M4 serving as a switch for selecting the light emission is turned on. The supply of the drive current to the electroluminescent device EL is controlled by a gate potential of the drive transistor M1 and the current flowing in the electroluminescent device EL is controlled. A period of time during which the electroluminescent device EL is emitting the light (non-light emission in the case of the black display data) is called a light emitting period.

In the pixel circuit of FIG. 6, to stably hold the voltage of the capacitor C1, an nMOS transistor whose leakage current is small is used as a transistor serving as a switch for the second program. This is because when the leakage current is large, the drive current in the light emitting period fluctuates.

However, as shown in FIG. 7, when a gate of the nMOS transistor M2 is switched from the high level to the low level in the programming period, the electric potential of the capacitor C1 is oscillated due to a parasitic capacitance between the gate and drain of the nMOS transistor M2, a voltage Vd(x, y) to be held drops by an amount of $V_M$, so that the current flowing in the drive transistor M1 is increased by an amount of $I_M$. In such a case, even in the case where the pixel of x-column and y-row is in the black display mode in the light emitting period, a small current flows in the pMOS transistor M4 due to the drop of the gate potential (holding voltage). Consequently, a small light emission is observed in spite of the black display mode. In other words, the darkest state cannot be normally obtained and it is difficult to assure the contrast.

In the embodiment, as shown in FIG. 1, the switch for the second program connected between the capacitor C1 (gate of the drive transistor M1) and the drain of the drive transistor M1 is constructed by a pMOS transistor M2a and an nMOS transistor M2b which are serially connected. That is, the construction of the pixel circuit of FIG. 1 differs from that of the comparison example of FIG. 6 with respect to a point that the nMOS transistor M2 in FIG. 6 is replaced by two switching transistors of the different conductivity types which are serially connected (pMOS transistor M2a and nMOS transistor M2b).

In the case of holding the voltage into the capacitor C1, since a gate of the pMOS transistor M2a is changed from the low level to the high level in the programming period, on the contrary to the potential change shown in FIG. 7, the electric potential of the capacitor C1 is oscillated due to the parasitic capacitance between the gate and drain and the voltage Vd(x, y) to be held is increased by an amount of $V_L$, so that the current flowing in the drive transistor M1 is decreased by an amount of $I_L$. Thus, the pixel current flowing in the black display mode can be eliminated or reduced.

As for the line sequential data line current signals, although the zero current is preferable in the black display mode, it is actually difficult to realize the zero current in terms of the circuit construction. If the current of the line sequential data line current signals is not equal to zero, a pixel current Id cannot be set to zero. In the construction of FIG. 6, when the nMOS transistor M2 is turned off, the voltage held in the capacitor C1 is oscillated and drops. Therefore, the pixel current Id rises further and it becomes further difficult to set the pixel current Id to zero.

If one of the switches for the second program is constructed by the pMOS transistor like an embodiment, since the direction of the electric potential in the capacitor C1 to be oscillated is reversed, even if the current of the line sequential data line current signals is not equal to zero, the pixel current Id in the black display mode can be set to zero or sufficiently reduced due to the increase in electric potential of the capacitor C1.

Although the leakage current of the pMOS transistor used in the embodiment is larger than that of the nMOS transistor, by adding the nMOS transistor M2b in series with the pMOS transistor like an embodiment, the leakage current is suppressed and the holding voltage Vd in the light emitting period can be stabilized.

Although the capacitor C1 can be individually formed as a capacitance device, it is not always necessary to be formed as a device but a parasitic capacitor formed between the gate and the drain (overlapped capacitor of a gate electrode and a drain electrode, or the like) can be also used.

FIGS. 13A to 13D are diagrams showing manufacturing steps of the portions of the pMOS transistor M2a and the nMOS transistor M2b serving as field effect type thin film transistors using low temperature polysilicon. FIG. 14 is a cross sectional view showing a construction of an EL display device manufactured by the manufacturing method of FIGS. 13A to 13D.

Figure 13A:
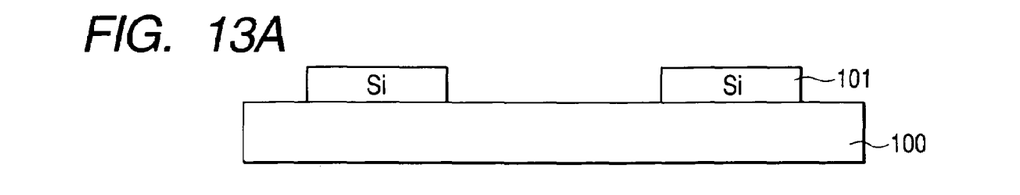
FIGS. 13A, 13B, 13C and 13D are diagrams showing manufacturing steps of the portions of a pMOS transistor M2a and an nMOS transistor M2b which are used in the invention.
Figure 14:
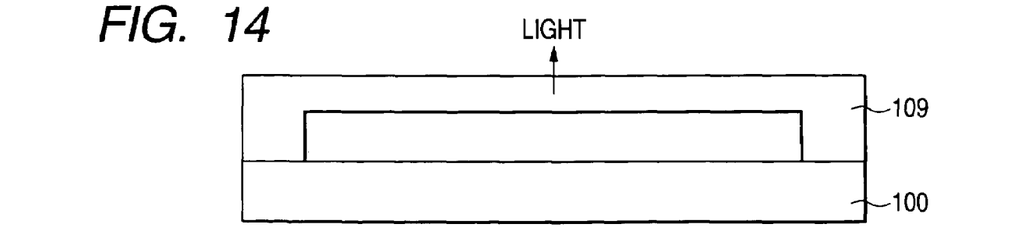
FIG. 14 is a cross sectional view showing a construction of an EL display device manufactured by the manufacturing method of FIG. 13.

As shown in FIG. 13A, after an amorphous silicon layer is deposited onto a glass substrate 100 by using a plasma CVD method, it is thermally treated (laser annealing) by a laser beam or the like to thereby form a polysilicon layer. By patterning it, polysilicon layers for the pMOS transistor M2a and the nMOS transistor M2b is formed.

In this step, it is also possible to execute channel doping of dopant (phosphorus or boron) for exhibiting the conductivity type opposite to that of the source-drain to at least one of the polysilicon layers as necessary and adjust a threshold value.

Figure 13B:
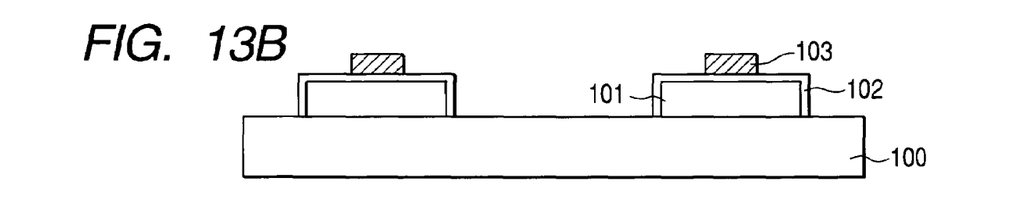

Subsequently, as shown in FIG. 13B, a gate insulating film 102 of $SiO_2$, SiN, or the like is formed, polysilicon is formed and patterned, and a gate electrode 103 is formed.

Figure 13C:
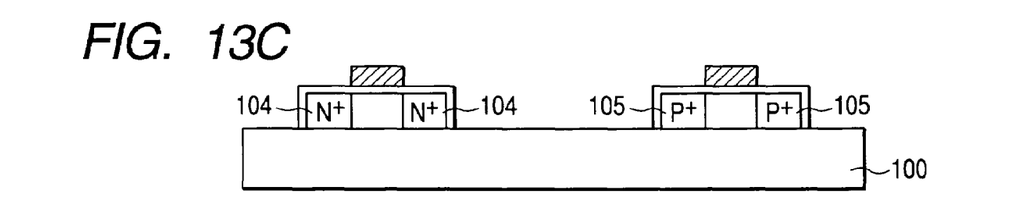

As shown in FIG. 13C, p-type impurities (phosphorus or the like) and n-type impurities (boron or the like) are ion-implanted and thermally diffused and source-drain regions 105 of the pMOS transistor M2a and source-drain regions 104 of the nMOS transistor M2b are formed.

Figure 13D:
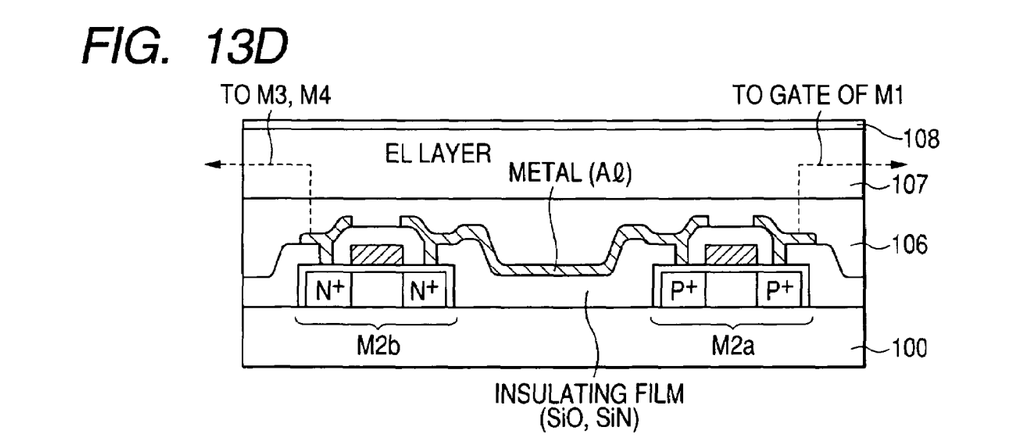

As shown in FIG. 13D, after the insulating film of $SiO_2$, SiN, or the like is formed, contact-holes are formed and a metal layer serving as source and drain electrodes and wirings is laminated and patterned. After that, a planarized film 106 is formed, through-holes are formed, an anode electrode (not shown) is formed and patterned, subsequently, an electroluminescent layer (EL layer) 107 is formed by evaporation deposition, ink-jet (liquid-jet) deposition or the like, and an ITO film 108 is formed. Whereby, electroluminescent light emitting elements disposed on pixel circuits and being electrically connected thereto. Preferably, the EL layer comprises a plurality of layers constructing what is called an organic LED. Further, it is preferable that the EL layer is separated and independent every pixel.

As shown in FIG. 14, the substrate 100 is sealed to a glass vessel 109 by glass, thereby completing the EL display device.

According to the embodiment described above, the transistor in which the leakage current of the pMOS transistor is extremely larger than that of the nMOS transistor is manufactured. However, there is also a case where the transistor in which the leakage current of the nMOS transistor is larger than that of the pMOS transistor is manufactured in dependence on the manufacturing processes. The invention is also suitably applied to such a case.

Second Embodiment

FIG. 9 is a diagram showing an example of a construction of a pixel circuit according to the second embodiment of the invention. The signals for making the pixel circuit operative are substantially the same as those shown in FIG. 2. In the first embodiment, as shown in FIG. 1, the pMOS transistor M2a is connected to the gate of the pMOS transistor M1 and the nMOS transistor M2b is connected to the drain of the pMOS transistor M1. However, in the second embodiment, as shown in FIG. 9, the nMOS transistor M2b is connected to the gate of the pMOS transistor M1 and the pMOS transistor M2a is connected to the drain of the pMOS transistor M1.

Other constructions are similar to those in the first embodiment.

According to the pixel circuit with such a connecting form as well, the operation and effects similar to those in the first embodiment can be obtained by a feedthrough of the nMOS transistor M2b in the ON state.

Third Embodiment

To make the pixel circuit shown in FIG. 1 or 9 operative, it is required that the capacitor C1 and the parasitic capacitor due to the intersection or the like of the wirings are charged by the line sequential data line current signals. Although it is required to control the pixel circuit 1 by a small current in order to obtain a high contrast ratio, there is a case where the charging time of the capacitor C1 and the parasitic capacitor becomes long due to the small current and the small current setting operation for one horizontal scan period is insufficient. Such a drawback becomes a further remarkable problem in a TFT circuit in which a threshold voltage variation ΔVth of the current drive transistor M1 of the pixel circuit 1 of each row is large. Since the capacitor C1 has to hold the current driving operation for one frame period of a video signal Video, its capacitance value cannot be set to a small value.

The embodiment intends to provide a construction in which even if the current signal that is inputted to the pixel circuit is a small current, the setting operation time can be shortened. The construction in which the voltage buffer is added to the pixel circuit as in the embodiment has been disclosed in, for example, JP-A-2004-118181. A source-follower circuit or a feedback type operational amplifier can be used as a voltage buffer.

FIG. 10 is a diagram showing an example of a construction of a pixel circuit and a voltage buffer circuit according to the third embodiment of the invention.

In the embodiment, a voltage buffer X whose output voltage is determined by an input voltage is provided every pixel circuit column. The voltage buffer X is constructed by a source-follower circuit. The source-follower circuit comprises a pMOS transistor and a current source. An output terminal side of the voltage buffer X (connecting point of the pMOS transistor and the current source) is connected to the nMOS transistor M2b and an input terminal side (gate of the pMOS transistor) is connected to the input signal line of the line sequential data line current signals Idata.

Other constructions are similar to those of the first embodiment.

As shown in FIG. 11, a feedback type operational amplifier can be also used as a voltage buffer in place of the source-follower circuit.

Also in this case, constructions other than the portions shown in FIG. 11 are similar to those of the first embodiment.

According to the embodiment, since the voltage of the same electric potential as that of the drain of the drive transistor M1 is held in the capacitor C1 by the operation of the voltage buffer, the current corresponding to the current signal Idata which is programmed in the pixel circuit can be allowed to flow in the active device EL.

In this manner, the driving in which the adverse influence by a variation in characteristics of every pixel of the drive transistor is suppressed can be executed in a manner similar to those of the first and second embodiments.

Although the example in which the pMOS transistor is used as a drive transistor M1 has been mentioned in each of the foregoing embodiments, in the case of using the nMOS transistor as a drive transistor M1, it is sufficient to reverse the polarities of the active device, signals, and power source. Specifically speaking, it is preferable that a drain of the nMOS transistor for driving is connected to a cathode side of an LED as an active device, an anode of the LED is connected to a high potential power source, and a source of the nMOS transistor for driving is connected to a low potential power source.

Various emitting devices such as inorganic LED, organic LED (organic EL), electron emitting device, semiconductor laser, and the like can be used as active devices (loads) which are used in the invention.

Further, although the invention is suitably used for the crystalline thin film transistor represented by what is called a low temperature poly-crystalline silicon, the circuit construction of the invention can be constructed by an amorphous silicon TFT, a mono-crystalline silicon TFT, a high temperature poly-crystalline silicon TFT, or the like.

Particularly, the invention is suitably applied to use for an active matrix type display device of a current driving type light emitting device such as an electroluminescent device (EL device) or the like.

This application claims priority from Japanese Patent Application No. 2004-186483 filed on Jun. 24, 2004, which is hereby incorporated by reference herein.

What is claimed is:

1. A light emitting apparatus comprising:
a plurality of pixel circuits arranged in a matrix,
a light emitting element being connected with at least one pixel circuit;
wherein said at least one pixel circuit comprises:
a drive transistor of a first conductivity type for controlling a current flowing in said light emitting element;
a capacitor provided at a control electrode of said drive transistor; and
a switch, connected to said control electrode of said drive transistor, for holding a drive control signal at said capacitor, said switch including a first switching transistor of the first conductivity type and a second switching transistor of a second conductivity type,
wherein a first main electrode of said first switching transistor of the first conductivity type and a second main electrode of said second switching transistor of the second conductivity type are connected,
wherein a second main electrode of said first switching transistor of the first conductivity type is connected to said control electrode of said drive transistor,
wherein a first main electrode of said second switching transistor of the second conductivity type is connected to one main electrode of said drive transistor,
wherein turning on both of said first switching transistor of the first conductivity type and said second switching transistor of the second conductivity type short-circuits said control electrode and said one main electrode of said drive transistor, and
wherein a third switching transistor of the second conductivity type for selecting a row is provided between said one main electrode of said drive transistor and a signal line,
a fourth switching transistor of the first conductivity type for selecting light emission is provided on a path of the current flowing in said display element, and
a control electrode of said second switching transistor of the second conductivity type, a control electrode of said third switching transistor for selecting the row, and a control electrode of said fourth switching transistor for selecting the light emission are connected to the same scan signal line.

2. A light emitting apparatus according to claim 1, wherein after the time when said first switching transistor of the first conductivity type is changed from ON to OFF, said second switching transistor of the second conductivity type is changed from ON to OFF.

3. A light emitting apparatus according to claim 1, wherein said drive transistor of the first conductivity type and said first switching transistor of the first conductivity type are p-channel type thin film transistors, and said second switching transistor of the second conductivity type is an n-channel type thin film transistor.

4. A light emitting apparatus according to claim 1, wherein said light emitting element is an electro-luminescent display element.

* * * * *